US008852964B2

(12) United States Patent
Kimura et al.

(10) Patent No.: US 8,852,964 B2
(45) Date of Patent: Oct. 7, 2014

(54) CONTROLLING CD AND CD UNIFORMITY WITH TRIM TIME AND TEMPERATURE ON A WAFER BY WAFER BASIS

(71) Applicant: Lam Research Corporation, Fremont, CA (US)

(72) Inventors: Yoshie Kimura, Castro Valley, CA (US); Tom Kamp, San Jose, CA (US); Eric Pape, Newark, CA (US); Rohit DeshPande, Fremont, CA (US); Keith Gaff, Fremont, CA (US); Gowri Kamarthy, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 13/758,266

(22) Filed: Feb. 4, 2013

(65) Prior Publication Data

US 2014/0220709 A1 Aug. 7, 2014

(51) Int. Cl.
*H01L 21/00* (2006.01)
*H01L 21/67* (2006.01)
*H01L 21/66* (2006.01)

(52) U.S. Cl.
CPC .......... *H01L 22/26* (2013.01); *H01L 21/67069* (2013.01)
USPC .................................................. 438/7; 438/9

(58) Field of Classification Search
USPC ....................................................... 438/5–14
See application file for complete search history.

(56) References Cited

U.S. PATENT DOCUMENTS

| | | | |
|---|---|---|---|
| 6,770,852 | B1 | 8/2004 | Steger |
| 6,911,399 | B2 | 6/2005 | Liu et al. |
| 6,972,524 | B1 | 12/2005 | Marakhtanov et al. |
| 7,018,780 | B2 | 3/2006 | Vahedi et al. |
| 7,560,007 | B2 | 7/2009 | Gaff |
| 7,774,082 | B2 | 8/2010 | Kubota et al. |
| 8,257,546 | B2 | 9/2012 | Davis et al. |
| 2002/0160628 | A1 | 10/2002 | Okoroanyanwu et al. |
| 2003/0219683 | A1 | 11/2003 | Nagarajan et al. |
| 2007/0221619 | A1 | 9/2007 | Cheng |
| 2009/0162950 | A1 | 6/2009 | Kuboi et al. |
| 2010/0214545 | A1 | 8/2010 | Funk et al. |
| 2011/0143462 | A1 | 6/2011 | Gaff et al. |
| 2011/0163420 | A1 | 7/2011 | Valdivia et al. |

OTHER PUBLICATIONS

Ho, Weng Khuen et al., "Critical Dimension and Real-Time Temperature Control for Warped Wafers," pp. 925-930, Seoul, Korea. IFAC. Jul. 6-11, 2008.

*Primary Examiner* — Richard Booth
(74) *Attorney, Agent, or Firm* — Buchanan Ingersoll & Rooney PC

(57) ABSTRACT

Exemplary embodiments are directed to controlling CD uniformity of a wafer by controlling trim time on temperature in a plasma processing system. The plasma processing system has a wafer support assembly including a plurality of independently controllable temperature control zones across a chuck and a controller that controls each temperature control zone. The controller receives process control and temperature data associated with at least one wafer previously processed in a plasma chamber of the plasma processing system, and critical device parameters of a current wafer to be processed in the plasma chamber. The controller calculates a target trim time and a target temperature profile of the current wafer based on the process control and temperature data, and the critical device parameters. The current wafer is trimmed during the target trim time while the temperature of each device die location is controlled based on the target temperature profile.

18 Claims, 2 Drawing Sheets

CONTROLLING CD AND CD UNIFORMITY WITH TRIM TIME AND TEMPERATURE ON A WAFER BY WAFER BASIS

FIELD

This disclosure relates to a method and system to control critical dimension (CD) uniformly of a wafer, and in particular to controlling the CD uniformly during plasma etching.

BACKGROUND INFORMATION

Various processes and techniques are known for controlling etch or trimming processes to reduce variation in feature profiles on a semiconductor wafer. For example, US 2011/0163420, which is hereby incorporated by reference in its entirety, describes a process of adjusting a photomask pattern by placing a polymer layer over an underlayer on the wafer. The mask is selectively trimmed to generate individual mask. The process involves various deposition and/or etch phases, which include trim steps to form features having an increased aspect ratio. U.S. Pat. No. 7,018,780, which is hereby incorporated by reference in its entirety, describes a technique for removing photoresist material from a semiconductor layer. The method is designed to control and reduce profile variation during photoresist trimming by applying a conformal layer of polymer over the photoresist mask and a portion of the wafer not covered by the mask. The thickness of the conformal layer varies depending on the region of the semiconductor. As a result, during trimming the center-to-edge profile variation of photoresist lines critical dimensions is controlled.

In other known processes, deposition and etching processes achieving a desired critical dimension (CD) target and CD uniformity pattern on the wafer can call for multiple optimization steps in a development cycle. For example, US 2011/0143462, which is hereby incorporated by references in its entirety, discloses a process in which the first optimization cycle can involve tuning the CD target by applying a trim step that controls the CD by varying the step time. After achieving the CD target, the uniformity can be optimized by tuning the electrostatic chuck (ESC) temperature which controls the wafer surface reaction temperature. This process can specify the use of multiple wafers and include the critical parameters being redeveloped every time a different CD target is requested, the incoming CD or CD uniformity changes. If the incoming wafer varies in comparison with the outgoing wafer with regard to an initial CD and CD uniformity, achieving an optimal post CD and CD uniformity target on a wafer by wafer basis is not feasible, as achieving a desired post CD and CD uniformity target uses an iterative process. In known systems, an etch tool designed for a specific lithography tool is used to ensure that any systematic non-uniformity inherent in etch tools could be compensated for by the lithography tool. Use of this tool, however, does not compensate for the non-uniformities resulting from process parameters of the recipe.

SUMMARY

A first embodiment relates to a method of controlling CD uniformity of the features of a wafer in a plasma processing system, the system having a wafer support assembly including a plurality of independently controllable temperature control zones arranged in proximity to device die locations above the temperature control zones on the wafer, and a controller that controls each temperature control zone, the method comprising: receiving process control and temperature data associated with at least one wafer previously processed in a plasma chamber of the plasma processing system; receiving critical device parameters of a wafer currently inserted in the plasma chamber; calculating a target trim time and a target temperature profile of the current wafer to be processed based on the process control and temperature data of the at least one previously processed wafer and the critical device parameters of the current wafer; and processing the current wafer for a duration of the target trim time where the temperature of each device die location is adjusted based on the target temperature profile.

A second embodiment relates to a system for controlling CD uniformity of a wafer in a plasma processing system, comprising: a wafer support assembly, including a plurality of independently controllable temperature control zones arranged in proximity to device die locations above the temperature control zones; and a controller configured to: receive critical device parameters of an incoming wafer and process recipe parameters over a network; calculate a target trim time and a target temperature profile of the incoming wafer based on the process control and temperature data of the at least one previously processed wafer and the critical device parameters of the incoming wafer; and adjust the temperature of each device die location for a duration of the target trim time based on the calculated target temperature profile.

A third embodiment relates to a non-transitory computer readable medium having program code encoded thereon for performing a method of controlling CD uniformity of a wafer in a plasma processing system having a wafer support assembly including a plurality of independently controllable temperature control zones arranged in proximity to device die locations above the temperature control zones on the wafer, and a controller that controls each temperature control zone, the method comprising: receiving process control and temperature data associated with at least one wafer previously processed in a plasma chamber of the plasma processing system; receiving critical device parameters of a current wafer to be processed in the plasma chamber; calculating a target trim time and a target temperature profile of the current wafer based on the process control and temperature data of the at least one previously processed wafers and the critical device parameters of the current wafer; and processing the current wafer for a duration of the target trim time where the temperature of each device die location is adjusted based on the target temperature profile.

BRIEF DESCRIPTION OF THE DRAWINGS

In the following, exemplary embodiments are described with reference to the attached drawings, in which.

DETAILED DESCRIPTION

Figure 1:
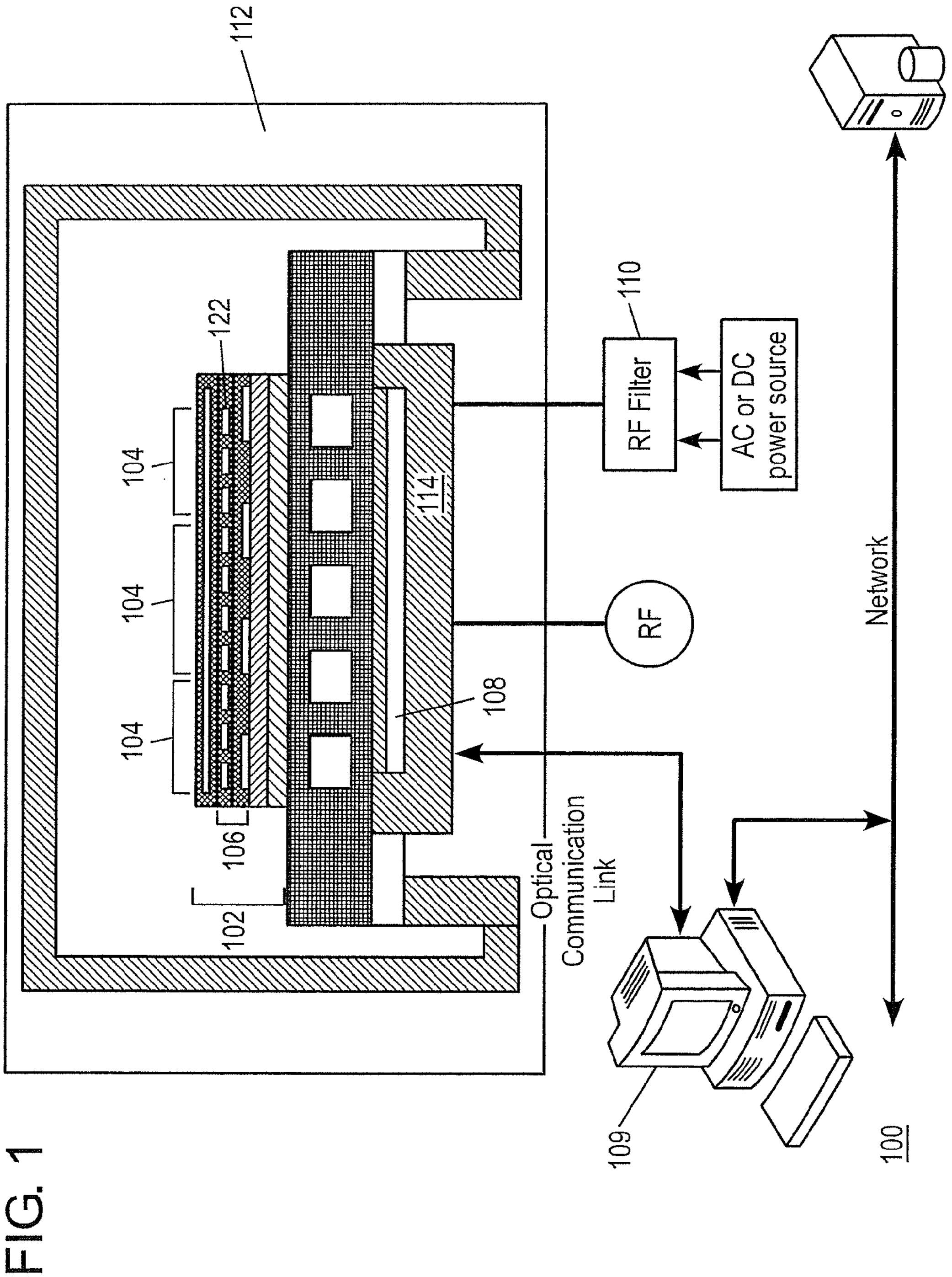
FIG. 1 illustrates an overview of a plasma etching system in accordance with an exemplary embodiment.

FIG. 1 illustrates an overview of a plasma processing system in accordance with an exemplary embodiment. As shown in FIG. 1, the plasma processing system 100 includes a wafer support assembly 102 including a plurality of independently controllable temperature control zones 104 arranged in proximity to device die locations above the temperature control zones 104 on the wafer (not shown). The temperature control zones 104 are assembled in a thermal plate 106, and are each independently controlled by a controller unit 108. The controller unit 108 can be arranged on a high or low side of an RF filter 110. When the controller unit 108 is on a low side of the RF filter 110, the controller unit 108 can be located within a plasma chamber 112 of the plasma processing system 100, where it can be attached to the wafer support assembly 102 or located proximate thereto. When on a low side of the RF filter 110, the controller unit 108 is enclosed in a Faraday shield 114 to protect electronics of the controller unit 108 from RF interference. The controller unit 108 can include a wired or wireless communications interface, such as fiber optic cabling, RF transceiver, RF shielded cabling or other suitable components for facilitating communication between the controller unit 108 and the network, a processor, or user interface 109, which is located on a high side of the RF filter 110 (e.g., external to the plasma chamber 112 or plasma processing system 100).

According to exemplary embodiments described herein, the plasma processing system can be used in processing the surface layers of a semiconductor wafer. For example, any of a photoresist layer, mask layer, deposition layer or other layer of a semiconductor wafer as desired, can be processed in a trim phase or cycle performed before or after a deposition phase or etch phase, or any combination thereof, according to a specified recipe. The recipe specifies parameters used to establish the proper environment in the plasma chamber for realizing the desired features and feature dimensions on the semiconductor wafer. The recipe can specify a type of reactant gas to be introduced in the plasma chamber at a specified flow rate, a pressure of the plasma chamber, and the power and frequency at which RF is provided to the ESC. For example, in an exemplary deposition-etch phase, 40 sccm of $CF_4$ and 90 sccm of $H_2$ gas can be introduced into the chamber, the chamber pressure can be set to 90 m Torr and an RF source can provide 1200 W of RF at a frequency of 27 $MH_z$.

During the trim phase or cycle material along a width of a wafer feature is removed, thereby affecting an aspect ratio (e.g. ratio of feature height to feature width), and critical dimensions (CD) of the wafer. According to exemplary embodiments disclosed herein the CD uniformity of a wafer to be processed can be controlled across a batch of wafers using secure parameters obtained and/or derived from wafers previously processed in the plasma chamber. The desired CD uniformity can be achieved by optimizing the time and/or temperature at which the wafer is processed during the trim phase or cycle.

The processing system can include a computer system or other suitable interface for providing control and/or process parameters for processing the features of the wafers.

The computer system can have at least one processor (e.g., a central processing unit (CPU)) that is coupled to memory or storage devices. The memory can include Random Access Memory (RAM), Read-Only Memory (ROM) or any other suitable memory device as desired. The CPU can also be coupled to any number of input/output devices, such as a display, keyboard, mouse, or any other suitable device as desired. The CPU can also be coupled to other processors or memory via a network.

During operation, the CPU can be configured to execute wafer processing according to software code stored in memory or on a computer readable medium, such as, Magnetic Storage Media (e.g. hard disks, floppy discs, magnetic tape), optical media (e.g., CD/DVD, ROM), or other compatible memory devices as desired. The CPU can also receive process data and/or parameters through any combination of input devices, such as mouse, keyboard, or network. Moreover, the CPU can output processing results and/or status to a user or operation via the display. The CPU can generate control signals based on software code and parameters input by a user, the control signals being provided to the controller unit 108 to generate a suitable temperature profile, through the tuning of the temperature control zones 104.

By tuning the power of each temperature control zone 104 under control of the controller unit 108, the temperature profile during processing can be shaped both radially and azimuthally. The temperature control zones 104 can be arranged in a defined pattern, such as, a rectangular grid, a hexagonal grid, or other suitable pattern for generating a temperature profile as desired. Each temperature control zone 104 of the thermal plate 106 can be of a similar size (e.g. ±0.10%) to a single device die on the wafer. The controller unit 108 includes a plurality of switches (not shown) used to selectively address power supply and power return lines connected to each temperature control zone 104.

In an exemplary arrangement, to minimize the number of electrical connections, the power supply and power return lines are arranged such that each power supply line is connected to a different group of temperature control zones 104 and each power return line is connected to a different group of temperature control zones 104 with each temperature control zone 104 being in one of the groups connected to a particular power supply line and one of the groups connected to a particular power return line.

No two temperature control zones 104 are connected to the same pair of power supply and power return lines. Thus, a respective temperature control zone 104 can be activated by directing electrical current through a pair of power supply and power return lines to which the temperature control zone 104 is connected.

Each temperature control zone 104 can include one or a plurality of temperature control elements 122. The power supplied to the temperature control elements 122 of each temperature control zone 104 can be smaller than 20 W, for example, or more preferably within a range of 5 to 10 W. The temperature control elements 122 can be Peltier devices and/or resistive heaters such as polyimide heaters, silicone rubber heaters, mica heaters, metal heaters (e.g. W, Ni/Cr alloy, Mo or Ta), ceramic heaters (e.g. WC), semiconductor heaters, carbon heaters, or any other suitable type of heating or cooling element as desired. The temperature control elements 122 can be implemented in various designs or configurations, such as being screen printed, wire wound, etched foil heaters, or any other suitable design as desired. The thickness of the temperature control elements 122 may range from 2 micrometers to 1 millimeter, and preferably within a range of 5-80 micrometers. To allow space between temperature control zones 104 and/or power supply and power return lines, the total area of the temperature control zones 104 can be up to 90% of the area of the upper surface of the wafer support assembly 102, e.g. 50-90% of the area. The power supply lines or the power return lines (power lines, collectively) can be arranged in gaps ranging from 1 to 10 mm between the temperature control zones 104, or in separate planes separated from the temperature control zones plane by electrically insulating layers (not shown).

In an exemplary embodiment, the power supply lines and the power return lines can be made as wide as the space allows, for carrying large current and reducing Joule heating. The power lines can be in the same plane as the temperature control zones 104, or can be on a plane different from the temperature control zones 104. The materials of the power supply and power return lines may be the same as or different from the materials of the temperature control elements 122. In an exemplary embodiment, the materials of the power supply and power return lines are materials with low resistivity, such as Cu, Al, W, Inconel™ or Mo.

The wafer support assembly 102 is operable to control the wafer temperature and consequently the plasma etching process at each device die location to maximize the yield of devices from the wafer. In an exemplary embodiment, the plasma etching system 100 preferably has at least 9 temperature control zones 104.

Figure 2:
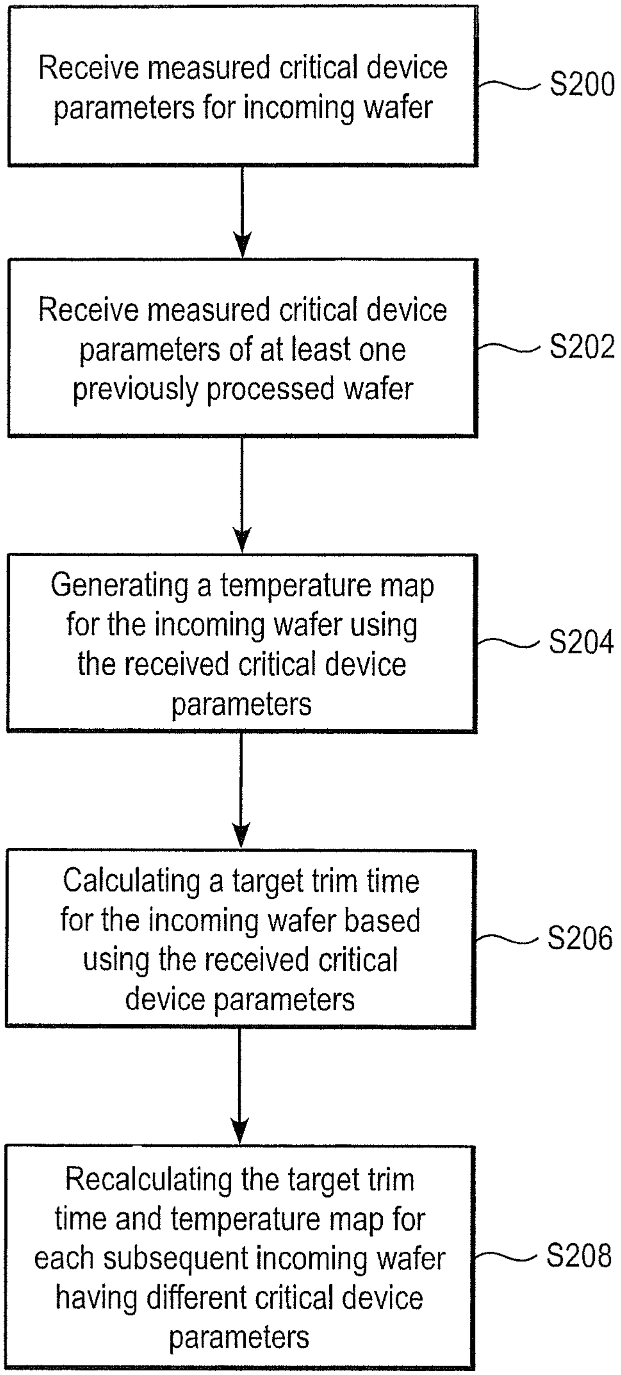
FIG. 2 is a flowchart of a method of optimizing CD uniformity of a wafer in accordance with an exemplary embodiment.

FIG. 2 is a flowchart of a method of optimizing CD uniformity of a wafer in accordance with an exemplary embodiment.

For each incoming wafer to be processed in the plasma chamber for a trim cycle or step in a trim cycle of an etch phase, for example, the controller can receive measured critical device parameters (e.g., pre-etch critical dimensions) at a plurality of device die locations on the wafer (S200). The critical device parameters can include line width, hole depth, percent fill, percent overfill, uniformity of coverage, or other suitable parameters as desired. The measured critical device parameters can be received at the controller unit 108 from an offboard measurement tool over the wired or wireless network connection, an onboard measurement tool, a user interface, or an external processor. In one exemplary embodiment, the off-board inspection tool can encompass an optical and/or electron beam inspection tool. In another exemplary embodiment, the user interface can embody a hardware or software interface as already discussed.

The controller unit 108 also receives measured critical device parameters that are associated with at least one previously processed wafer or outgoing wafer (S202). The measured critical device parameters are obtained during a process in which for each step, trim time can be varied (e.g., adjusted) along with a variation in temperature. The varied trim time can be applicable to the entire wafer, whereas the temperature variations can be independently applied to each temperature control zone 104 to achieve a specified temperature profile. That is, during an exemplary processing phase or phase cycle the controller unit 108 can independently adjust each temperature control zone to a specified temperature thereby controlling CD uniformity. The previously processed wafers can include at least one wafer that is processed at a time immediately adjacent to the incoming wafer and/or at least one wafer that is processed at any time prior to the processing of the current or incoming wafer. The controller unit 108 uses the received critical device parameters to generate a temperature map (e.g., temperature sensitivity map), which associates a value with the sensitivity of critical device parameters at various locations on the incoming or current wafer in relation to the control parameters (S204). The temperature sensitivity map is a function of location and can be measured with respect to process time and/or process temperature.

Using the measured critical device parameters of the incoming wafer and the previously processed wafers, for a specified trim phase or cycle, the controller unit 108 calculates a target trim time and a target temperature profile of the incoming wafer (S206). The target trim time is the duration during which a trim process on the wafer is executed, and is calculated for an entire surface of the incoming wafer. The target temperature profile is the temperature at which the incoming wafer is to be processed to maintain CD uniformity and is calculated for each temperature control zone of the wafer support assembly. The controller unit 108 receives data from the plasma etch assembly to process the incoming wafer for a duration of the target trim time, where the temperature of each device die location is adjusted based on the target temperature profile. The ESC temperature can be controlled based on the target temperature profile by setting the temperature control zones 104 to an appropriate temperature. As already discussed, the temperature control zones 104 are controlled independently and at a granularity dependent on the number of temperature control zones 104 on the wafer support assembly. As a result, CD uniformity can be controlled as a function of the ESC temperature.

When a new wafer is to be processed in the plasma etching system, and this wafer has different initial critical dimensions (CD) and CD uniformity than the immediately preceding wafer, based on an exemplary method described herein the controller can recalculate the target trim time and temperature control map to achieve the desired post trim CD and CD uniformity for the new wafer (S208).

The exemplary embodiments can be implemented according to various approaches. For example, each approach can vary in the manner temperature and/or trim time for each trim phase or trim cycle is adjusted during the processing of the wafer. In each exemplary approach, trim recipe parameters that define the dependence of target post-trim critical device parameters on measured pre-trim critical device parameters and trim temperatures are received at the controller unit 108 via a hardware, software, and/or memory interface. Using various parameters, such as the trim process recipe parameters, target post-etch and post-deposition critical device parameters, and measured critical device parameter, a temperature sensitivity map can be calculated for an incoming or current wafer to be processed and used to determine optimal temperatures for the term phase at predetermined locations on the wafer.

In one exemplary approach, CD uniformity can be optimized during a trim phase or cycle by adjusting the temperature for each temperature control zone 104 for the duration of the trim time. In this exemplary approach the trim time is predetermined and provided to the controller 108 via the interface. To determine the ESC temperature so that each temperature control zone 104 can be properly adjusted, the controller unit 108 uses the critical dimension (CD) parameters of at least two previously processed wafers to calculate temperature coefficients for the temperature sensitivity map. For example, a first wafer $W_1$ can have a CD uniformity of −5 nm at a process temperature of 30° C. A second wafer $W_2$ can have a CD uniformity of −10 nm and an ESC temperature of 40° C. Based on the critical dimension data of $W_1$ and $W_2$, the target CD uniformity CDBias of the current or incoming wafer is $-5\text{ nm}<CD_{Bias}<-10\text{ nm}$, or between the Bias of $W_1$ and $W_2$ the target ESC temperature T is 30° C.<T<40° C. The CDBias is defined as the difference between the CD of a wafer layer prior to etching and the CD of the layer realized after etching or within a 10° C./(±5° C.) range of the temperature $W_1$ and $W_2$.

The controller unit 108 receives data such as the critical device parameters for the previously processed first and second wafers W1 and W2, along with the trim temperature data for each respective previously processed wafer. Next, radial temperatures for each temperature control zone 104 are selected and wafers W1 and W2 are processed according to the selected temperatures so that a RadiallyBestWafer (e.g., previously processed wafer providing the best CD results) can be determined and a radial temperature setpoint can be obtained. The critical device parameters from the RadiallyBestWafer are then provided to the controller unit 108. For example, the best wafer result determined after etch inspection (AEI), such as, after the wafer has been removed from the plasma chamber (AEICurrentBest) and the best wafer result after development inspection (ADI), such as, before the wafer goes into the plasma chamber (ADICurrentBest) critical device parameters can be input to the controller manually through an interface (e.g., software, hardware, memory) or over the network through a host computer or processor. The ADI parameters from a new wafer (ADINEW(x,y)) can also be input to the controller unit 108. Prior to determining the coefficients for the temperature map, the slope of the CD Bias with respect to the timing and temperature of the trim phase must be determined from the data of the previously processed wafers as follows:

$$\text{CDBias(Temp)=Slope}\times\text{Temp+Intercept} \tag{1}$$

$$\text{Slope}(x, y) = \frac{CDBiasW2(x, y) - CDBiasW1(x, y)}{b\ ^{\circ}C}, \tag{2}$$

where the x and y values relate to trim temperature and trim time, respectively, and b is the difference in temperature of the wafer support assembly 102 (e.g., ESC temperature) between $W_1$ and $W_2$. In other exemplary embodiments, the slope can be a function of radial values Slope(r) or a constant (e.g., SlopeConstant).

Once the slope is determined, the controller unit 108 performs various calculations using the post-etch and post-deposition critical device parameters and the slope, to obtain a temperature sensitivity map for the incoming wafer. From the calculations, the controller unit 108 determines point-by-point values for temperature coefficients at various spatial locations on the wafer. In an exemplary process for generating the sensitivity map, point by point CDBias values for the current wafer are calculated using:

$$\text{CDBiasCurrentBest}(x,y)=\text{AEICurrentBest}(x,y)-\text{ADICurrentBest}(x,y) \tag{3}$$

where CDBiasCurrentBest are point-by-point values of the wafer (W1 or W2) that produces the best CD results, AEICurrentBest are point-by-point values of the best AEI results of either wafer W1 or W2, and ADICurrentBest are point-by-point values of the best ADI results of either wafers W1 or W2.

From Equation (3) an average CDBias of best wafer (CDBiasCurrentBestWaferAverage) is obtained, and an average of the ADI values of the new wafer (ADINewWaferAverage) is calculated as follows:

$$\text{ADINew}(x,y)\rightarrow\text{ADINewWaferAverage} \tag{4}$$

where ADINew(x,y) are point-by-point target after development inspection (ADI) CD values of the incoming or current wafer to be processed. The AD/New values are provided to the controller unit 108 through the interface. The controller unit 108 calculates an average of the AEI CD parameters of the new wafer (AEINewWaferAverage) as a difference between the average of the CDBias parameters of the best wafer (CDBiasCurrentBestWafer) calculated from Equation (3) and the average ADI of the new wafer (ADINewWaferAverage) calculated in Equation (4) as follows:

$$\text{AEINewWaferAverage}=\text{CDBiasCurrentBestWaferAverage}-\text{ADINewWaferAverage} \tag{5}$$

The controller unit 108 determines a point by point CDBias of the new wafer (CDBiasNew(x,y)) from a difference between the AEI CD parameters of the new wafer (ADINewWaferAverage) of Equation (5) and the ADI CD parameters of the new wafer (ADINew) of Equation (4), $$\text{CDBiasNew}(x,y)=\text{AEINewWaferAverage}-\text{ADINew}(x,y) \tag{6}$$

A CDBias offset is calculated as a difference between the CDBias of the current best wafer (Equation (3)) and the CDBias of the new wafer (Equation (6)), $$\text{CDBiasOffset}=\text{CDBiasNew}(x,y)-\text{CDBiasCurrentBest}(x,y) \tag{7}$$

Once the CDBias offset is obtained from Equation (7), the delta temperature demand map can be calculated from the CDBiasOffset and the slope as follows:

$$DeltaTemp(x, y) = \frac{CDBiasOffset(x, y)}{\text{Slope}} \tag{8}$$

Equations (1)-(8) are provided for calculating a temperature map for an initial wafer in a batch of wafers being processed by the process etch tool. For each subsequent wafer to be processed, a point-by-point CDBias of the best previously processed wafer is obtained follows:

$$\text{CDBias}(x,y)=\text{AEI}(x,y)-\text{ADI}(x,y) \tag{9}$$

where AEI(x,y) and ADI(x,y) are the point-by-point after etch inspection (AEI) parameters and after development inspection (ADI) parameters, respectively, of the previously processed wafer. The AEI and ADI parameters, along with temperature setpoint data are input to the controller unit 108 through the user interface. The CDBias(Temp) (Equation 1) and the Slope(x,y) (Equation 2) are also values that are input by a user.

Next, the controller unit 108 calculates an average CDBias (AverageCDBiasPreviousBest) from one of the previously processed wafers providing the best CD results. After obtaining this value, the controller unit 108 calculates a point-by-point CDBias offset based on the Average CD Bias, as follows:

$$\text{CDBiasOffset}(x,y)=\text{CDBias}(x,y)-\text{AverageCDBiasPreviousBest} \tag{10}$$

The CDBiasOffset and the Slope are used to calculate the point by point temperature offset (DeltaTemp (x,y) specified by the previous wafer as follows:

$$DeltaTemp(x, y) = \frac{CDBiasOffset(x, y)}{\text{Slope}} \tag{11}$$

A new temperature demand map of the new wafer is calculated using the temperature offset of Equation (11) and a Hydra file of the previous wafer as follows:

$$\text{NewTempDemandMap}(x,y)=\text{CurrentBestHydraFile}(x,y)+\text{DeltaTemp}(x,y) \tag{12}$$

The controller unit 108 uses the values provided in the temperature demand map to set the temperature and timing of the trim phase or trim cycle for the new wafer.

In a second exemplary approach for optimizing CD uniformity, ESC temperature (e.g., temperature of the temperature control zones 104) and trim timing are adjusted in a single step. In this exemplary embodiment, the CDBias of a current wafer is determined as a function of temperature and trim time. For example, the CDBias can be calculated from the following:

$$\text{CDBias(Temp,TrimTime)=TrimRate(Temp)}-\text{TrimTime+CDBiasWithoutTrim} \tag{13}$$

where TrimRate is the rate at which the current wafer is trimmed as a function of temperature, TrimTime is the time allotted for completing the trim phase or cycle, and CDBiasWithoutTrim is the CDBias of a wafer having a specified ESC temperature and with no trim phase or cycle being performed (e.g., TrimTime and TrimRate are both zero (0)).

At least three previously processed wafers will be used to generate the temperature sensitivity map for a current wafer, where Wafer 1 (W1) is processed for a TrimTime (E1=m+n) at an TrimRate(ER1) and at an ESC temperature (T1=a° C.); Wafer 2 (W2) is processed for TrimTime (E2=E1) and at a TrimRate (ER2) and at an ESC temperature (T2=a+b° C.); and Wafer 3 (W3) is processed for TrimTime (E3=m), at a TrimRate(ER3) and at an ESC temperature (T3=T1). Before the temperature and TrimTime can be determined, coefficients for the temperature sensitivity map must be obtained.

In a first step, radial temperatures are selected for each of wafers W1, W2, and W3 and the wafers are processed to calculate the RadiallyBestWafer. The controller unit 108 receives through the user interface the after etch inspection (AEICurrentBest) and after development inspection (ADICurrentBest) critical device parameters of the wafer producing the best CD results, respectively, the temperature setpoint (Temperature Setpoint) for best results of wafers W1, W2, and W3, and the TrimTime values (Trim TimeCurrentBest) of the best result of wafers W1, W2, and W3. The controller also receives the target after etch inspection parameters AEI(x,y) of a new wafer as an average value (AEINewWaferAverage) and after development inspection (ADINew(x,y)) parameters for the new wafer.

Next, five additional parameters are calculated prior the temperature sensitivity map of the incoming wafer being generated. These parameters include the CDBias for a wafer not being trimmed (CDBiasWithoutTrim), an average CDBias for a wafer not being trimmed (CDBiasWithoutTrimAverage), a slope of the trim rate (TrimRateSlope(x,y)), a trim rate intercept (TrimRateIntercept (x,y)), and an average trim rate (AverageTrimRate (a+b/2° C.)), are determined on a point-by-point basis or average. The TrimRateSlope is the ratio of CDBias values to TrimRate for a wafer, and the TrimRateIntercept is the value of TrimRate when the CDBias value at a specified point on the wafer is zero (0).

For example, CDBiasWithoutTrim is calculated as follows:

$$CDBiasWithoutTrim(x, y) = CDBiasW3(x, y) - m \cdot \frac{[CDBiasW1(x, y) - CDBiasW3(x, y)]}{n}, \tag{14}$$

where CDBiasW3(x,y) represents the point-by-point CDBias for W3, CDBiasW1(x,y) represents the point-by-point CDBias for W1, m is the TrimTime for W3, and n is the difference in TrimTime between W1 and W3.

The slope of the trim rate is calculated according to Equation (15) as follows, $$TrimRateSlope(x, y) = \frac{\left[\frac{CDBiasW2(x, y) - CDBiasWithoutEtch(x, y)}{m+n}\right] - \left[\frac{CDBiasW1(x, y) - CDBiasW3(x, y)}{n}\right]}{b}, \tag{15}$$

where b is the temperature difference between W1 and W2.

The trim rate intercept is calculated according to equation (16):

$$TrimRateIntercept(x, y) = \left[\frac{CDBiasW1(x, y) - CDBiasW3(x, y)}{n}\right] - TrimRateSlope(x, y) \cdot a, \tag{16}$$

where a is the ESC temperature for W1.

The average trim rate is calculated from equation (17) as follows:

$$AverageTrimRate\left(a + \frac{b}{2}\ ^\circ\text{ C.}\right) = TrimRateSlopeWaferAverage \cdot \left(a + \frac{b}{2}\right) + TrimRateInterceptWaferAverage \tag{17}$$

Based on the above values provided to the controller unit 108, the controller 108 obtains an after-etch inspection average target value (AEINewWaferAverage) of the incoming or current wafer from the after-etch inspection critical dimension parameters (AEINew(x,y)) of the incoming or current wafer. An average after development inspection target value (ADINewWaferAverage) is also calculated from the post-deposition critical parameters (ADINew(x,y)) of the incoming or current wafer to be processed. The AEINewWaferAverage and the ADINewWaferAverage values are used to calculate the trim time for the new wafer as follows:

$$TrimTimeNew = \frac{AEINewWaferAverage - ADINewWaferAverage - CDBiasWithoutTrimWaferAverage}{AverageTrimRate\left(a + \frac{b}{2}\ ^\circ\text{ C.}\right)} \tag{18}$$

The controller unit 108 next calculates a point-by-point CDBias for the incoming or current wafer as follows:

$$\text{CDBiasNew}(x,y) = \text{AEINew}(x,y) - \text{ADINew}(x,y) \tag{19}$$

Next, using the CDBias of the new or incoming wafer, the controller unit 108 executes a point-by-point temperature calculation for the incoming wafer as follows:

$$TempNew(x, y) = \frac{\frac{CDBiasNew(x, y) - CDBiasWithoutTrim(x, y)}{TrimTimeNew} - TrimRateIntercept(x, y)}{TrimRateSlope(x, y)} \tag{20}$$

The controller unit 108 calculates the best CDBias for a previously processed wafer as follows:

$$\text{CDBiasCurrentBest}(x,y) = \text{AEICurrentBest}(x,y) - \text{ADICurrentBest}(x,y) \tag{21}$$

Next, the controller unit 108 calculates a point-by-point temperature calculation for the best previously processed wafer, as follows:

$$TempCurrentBest(x, y) = \frac{\frac{CDBiasCurrentBest(x, y) - CDBiasWithoutTrim(x, y)}{TrimTimeCurrentBest} - TrimRateIntercept(x, y)}{TrimRateSlope(x, y)} \tag{22}$$

To optimize the non-uniformity of the critical dimensions of the new wafer, the controller unit 108 calculates the offset temperature between the incoming wafer and the previously processed wafer as follows:

$$\text{DeltaTemp}(x,y)=\text{TempNew}(x,y)-\text{TempCurrentBest}(x,y) \quad (23)$$

The temperature map of the incoming wafer is next calculated using the temperature offset of Equation (23) and the Hydra file of the wafer producing the best CD results as follows:

$$\text{NewTempMap}(x,y)=\text{CurrentBestFile}(x,y)+\text{DeltaTemp}(x,y) \quad (24)$$

For each new wafer to be processed, the controller unit 108 can use the parameters obtained from the wafer (W1, W2, or W3) producing the best results to determine the temperature map for an incoming wafer.

For example, following the point-by-point calculation of the CDBias from the best wafer CDBias (x,y), an average CDBias of the best previous wafer (AverageCDBiasPreviousBest) is obtained.

Next a point-by-point calculation of the CDBias offset is obtained from the Average CDBias of the best previous wafer as follows:

$$\text{CDBiasOffset}(x,y)=\text{CDBias}(x,y)-\text{AverageCDBiasPreviousBest} \quad (25)$$

The point-by-point temperature offset as specified from the best previous wafer is determined from:

$$DeltaTemp(x, y) = \frac{CDBiasOffset(x, y)}{Slope} \quad (26)$$

Using the offset temperature, the controller unit 108 calculates a temperature demand map for a new wafer as follows:

$$\text{NewTempMap}(x,y)=\text{PreviousHydraFile}(x,y)+\text{DeltaTemp}(x,y) \quad (27),$$

where PreviousHydraFile(x,y) is the temperature map of the best previously processed wafer.

In another exemplary embodiment of the present disclosure, the target critical dimensions are determined for an etch process where for each process step both temperature and trim time are adjusted. In this exemplary approach, the critical device parameters of four previously processed wafers (W1, W2, W3, and W4) can be used to obtain and optimize the temperature coefficients. For example, Wafer 1 (W1) is processed at a Trim Time (E1=m), a TrimRate (ER1) and a temperature (T1=a° C.). Wafer 2 (W2) is processed at a Trim Time(E2=E1), a TrimRate(ER2), and an ESC temperature (T2=a+b° C.). Wafer 3 (W3) is processed at a Trim Time (E3=m+n), a TrimRate (ER3), and an ESC temperature (T3=T1). Wafer 4(W4) is processed at a Trim Time (E4=m+n), a TrimRate (ER4), and an ESC temperature (T4=T2). Using the critical device parameters of the four wafers the controller unit 108 can calculate the CDBias for an incoming wafer as follows:

$$\text{CDBias}=\text{TrimRate}(\text{Temp})\cdot\text{TrimTime}+\text{CDBiasWithoutTrim}(\text{Temp}) \quad (29).$$

To calculate the temperature sensitivity map the AEI and ADI parameters of all four previously processed wafers should be provided to the controller unit 108. Next, the radial temperature zone setpoint can be determined by variously selecting radial temperatures and processing the wafers at the selected temperatures to obtain the best critical dimensions using the radial uniformity technique.

After the radially best CD wafer is determined, the associated after-etch inspection (AEICurrentBest) and after development inspection (ADICurrentBest) parameters of the best CD wafer are obtained. The temperature setpoint for wafers W1 through W4, and the trim time values (Trim TimeCurrentBest) for wafers W1 through W4 are sent to the controller unit 108 either through an interface (e.g., software, hardware, or memory) or over the network from a host computer (e.g., process, server, or other remote processing device on the network). The after etch inspection (AEINewWaferAverage or AEINew(x,y)) and after development inspection (ADINew (x,y)) critical device parameters for an incoming new wafer are also sent to the controller unit 108.

The following values are calculated also provided to the controller unit 108 through the user interface:

$$TrimRate(Temp = a, x, y) = \frac{CDBiasW3(x, y) - CDBiasW1(x, y)}{n}, \quad (30)$$

where a is the ESC temperature associated with wafers W1 and W3, and n is the difference in Trim Time between wafers W1 and W3;

$$TrimRate(Temp = a, x, y) = \frac{CDBiasW4(x, y) - CDBiasW2(x, y)}{n}, \quad (31)$$

where a is the ESC temperature at which W1 and W4 are processed and n is the difference in Trim Time between wafers W4 and W2;

$$\text{CDBiasWithoutTrim}(\text{Temp}=a,x,y)=\text{CDBias}W1(x,y)-\text{TrimRate}(\text{Temp}=a,x,y)\cdot m \quad (32),$$

where m is the Trim Time of wafer W1.

$$TrimRateSlope(x, y) = \frac{TrimRate(Temp = a + b, x, y) - TrimRate(Temp = a, x, y)}{n}, \quad (33)$$

where b is the difference in ESC temperature between wafers W4 and W2 and between wafers W3 and W1; and $$\text{TrimRateIntercept}(x,y)=\text{TrimRate}(\text{Temp}=a,x,y)-\text{TrimRateSlope}(x,y)\cdot a \quad (34),$$

where the TrimRateIntercept is the point at which the TrimRate of previously processed wafers (W1, W2, W3, W4) is zero.

The controller unit 108 also receives TrimRateAverage through the user interface, which is calculated based on the following equation:

$$TrimRateAverage\left(Temp = a + \frac{b}{2}, x, y\right) = \frac{TrimRate(Temp = a, x, y) + TrimRate(Temp = a + b, x, y)}{2}. \quad (35)$$

The controller unit 108 receives CDBiasWithoutTrimSlope which is determined using Equation (36) as follows:

$$CDBiasWithoutTrimSlope(x, y) = \frac{CDBiasWithoutTrim(Temp = a + b, x, y) - CDBiasWithoutTrim(Temp = a, x, y)}{b}, \quad (36)$$

where the CDBiasWithoutTrimSlope includes a series of points where the TrimTime is constant or is not adjusted.

Based on the results, of Equations (35) and (36), the controller unit 108 calculates the CDBiasWithoutTrimIntercept and the CDBiasWithoutTrimAverage as follows:

$$\text{CDBiasWithoutTrimIntercept}(x,y) = \text{CDBiasWithoutTrim}(\text{Temp}=a,x,y) - \text{CDBiasWithoutTrimSlope}(x,y) \cdot a \quad (37),$$

where the CDBIasWithoutTrimIntercept is the point at which the CD Bias of a wafer not being trimmed is zero, and $$CDBiasWithoutTrimAverage\left(Temp = a + \frac{b}{2}, x, y\right) = \frac{CDBiasWithoutTrim(Temp = a, x, y) + CDBiasWithoutTrim(Temp = b, x, y)}{2} \quad (38)$$

where CDBiasWithoutTrimAverage is the average of the point-by-point analysis of the CD Bias values of a wafer that is not trimmed.

Once the above parameters are provided to the controller unit 108, the controller unit 108 initiates the calculation of the temperature sensitivity coefficients. During this process, the controller obtains an average of after-etch inspection coefficients (AEINewWaferAverage). This value can be received by the controller unit 108 over the network or can be received as a point-by-point map (AEINew(x,y)), from which the controller unit 108 can calculate AEINewWaferAverage.

Next, the average after development inspection parameters for the incoming wafer (ADINewWaferAverage) are calculated from the point-by-point map of the after-etch inspection critical parameters (ADINew(x,y)) of the incoming wafer.

Using the AEI and ADI values, the controller unit 108 calculates the TrimTime as follows:

$$TrimTimeNew = \frac{AEINewWaferAverage - ADINewWaferAverage - CDBiasWithoutTrimWaferAverage}{AverageTrimRate\left(a + \frac{b}{2}\ ^\circ \text{C.}\right)} \quad (39)$$

Next, the controller unit 108 calculates point-by-point CDBias values for the incoming wafer as follows:

$$\text{CDBiasNew}(x,y) = \text{AEINew}(x,y) - \text{ADINew}(x,y) \quad (40)$$

Using the results of Equations (39) and (40), CDBias values, the unit 108 controller next calculates point-by-point temperature values for the incoming wafer as follows:

$$TempNew(x, y) = \frac{CDBiasNew(x, y) - TrimRateIntercept(x, y) \cdot TrimTimeNew - CDBiasWithoutTrimIntercept(x, y)}{TrimRateSlope(x, y) \cdot TrimTimeNew + CDBiasWithoutTrimSlope(x, y)} \quad (41)$$

Next, point-by-point values for the best previously processed wafer are calculated as follows:

$$\text{CDBiasCurrentBest}(x,y) = \text{AEICurrentBest}(x,y) - \text{ADICurrentBest}(x,y) \quad (42)$$

Once the CDBias of a previously processed wafer is obtained, the controller unit 108 can determine the point-by-point temperature values for the previously processed wafer according to the following:

$$TempCurrentBest(x, y) = \frac{CDBiasCurrentBest(x, y) - TrimRateIntercept(x, y) \cdot TrimTimeCurrentBest - CDBiasWithoutTrimIntercept(x, y)}{TrimRateSlope(x, y) \cdot TrimTimeCurrentBest + CDBiasWithoutTrimSlope(x, y)} \quad (43)$$

From a difference between the temperature values of the best previously processed wafer (TempCurrentBest(x,y)) and those of the incoming wafer (TempNew(x,y)), the controller unit 108 calculates the temperature offset of the incoming wafer:

$$\text{DeltaTemp}(x,y) = \text{TempNew}(x,y) - \text{TempCurrentBest}(x,y) \quad (44)$$

The temperature offset is then used to determine the temperature map of the incoming wafer:

$$\text{NewTempMap}(x,y) = \text{CurrentBestFile}(x,y) + \text{DeltaTemp}(x,y) \quad (45),$$

where CurrentBestFile is the temperature profile of the best previously processed wafer.

For each next (e.g., incoming, new) wafer to be processed, the controller unit 108 can use a previous best wafer from at least four previously processed wafers to determine the coefficients of and the overall temperature sensitivity map for the incoming wafer.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method of controlling CD uniformity of features of a wafer in a plasma processing system, the system having a wafer support assembly including a plurality of independently controllable temperature control zones arranged in proximity to device die locations above the temperature control zones on the wafer, and a controller that controls each temperature control zone, the method comprising:

receiving process control and temperature data associated with at least one wafer previously processed in a plasma chamber of the plasma processing system;

receiving critical device parameters of a wafer currently inserted in the plasma chamber;

calculating a target trim time and a target temperature profile of the current wafer to be processed based on the process control and temperature data of the at least one previously processed wafer and the critical device parameters of the current wafer; and processing the current wafer for a duration of the target trim time where the temperature of each device die location is adjusted based on the target temperature profile.

2. The method of claim 1, wherein the at least one previously processed wafer is a are test wafer that is processed using at least one trim time and at least one temperature profile.

3. The method of claim 1, wherein the target trim time is calculated for an entire surface of the wafer.

4. The method of claim 1, wherein calculating the target temperature profile of the current wafer comprises calculating an operating temperature for each temperature control zone.

5. The method of claim 1, wherein the process control and temperature data associated with the at least one previously processed wafer is received from memory.

6. The method of claim 1, wherein feature dimensions of the current wafer are received from memory.

7. The method of claim 1, wherein feature dimensions of the current wafer are received from a user interface.

8. The method of claim 1, wherein the process control data associated with at least one previously processed wafer comprises pre-etch critical device parameters and post-etch parameters.

9. The method of claim 1, further comprising:

recalculating a target etch timing and a target temperature profile for each successive wafer to be processed after the current wafer using the process control and temperature data of the at least one previously processed wafer and respective feature dimensions of each successive wafer, respectively received in the plasma processing system.

10. The method of claim 1, wherein the target temperature profile is a spatial temperature profile or a temporal temperature profile.

11. The method of claim 1, comprising:

mapping a sensitivity profile of the received critical device parameters; and calculating the target trim time and the target temperature profile based on the mapped sensitivity profile, the process control and temperature data of the at least one previously processed wafer and the critical device parameters of the current wafer.

12. The method of claim 1, wherein the at least one previously processed wafer is processed at a time that is temporally adjacent to the current wafer.

13. The method of claim 1, wherein the at least one previously processed wafer is processed at any time prior to receiving the current wafer in the plasma processing chamber.

14. The method of claim 1, wherein the at least one previously processed wafer comprises a batch of wafers.

15. The method of claim 14, wherein the process temperature data of the at least one previously processed wafer is an average of the process temperature data of the batch of wafers.

16. The method of claim 1, wherein the target trim time is calculated using $$TrimTimeNew = \frac{AEINewWaferAverage - ADINewWaferAverage - CDBiasWithoutTrimWaferAverage}{AverageTrimRate\left(a + \frac{b}{2}\,°C\right)}$$

where AEINewWaferAverage is an average of the after-etch inspection parameters of the current wafer, ADINewWaferAverage is the average of wafer parameters after development inspection of the current wafer, CDBiasWithoutTrimWaferAverage is an average CDBias of at least one previously processed wafer without a trim step performed, AverageTrimRate is an average of the trim rate of the at least one previously processed wafer, a is an ESC temperature of a first previously processed wafer, and b is a difference in ESC temperature of the first previously processed wafer and a second previously processed wafer.

17. The method of claim 1, wherein the target temperature profile of the current wafer is calculated using $$NewTempMap(x,y)=CurrentBestFile(x,y)+DeltaTemp(x,y),$$

where CurrentBestFile is a temperature profile of a best previously processed wafer, and Delta Temp is a temperature offset of the current wafer to be processed.

18. A non-transitory computer readable medium having program code encoded thereon for performing a method of controlling CD uniformity of a wafer in a plasma processing system having a wafer support assembly including a plurality of independently controllable temperature control zones arranged in proximity to device die locations above the temperature control zones on the wafer, and a controller that controls each temperature control zone, the method comprising:

receiving process control and temperature data associated with at least one wafer previously processed in a plasma chamber of the plasma processing system;

receiving critical device parameters of a current wafer to be processed in the plasma chamber;

calculating a target trim time and a target temperature profile of the current wafer based on the process control and temperature data of the at least one previously processed wafer and the critical device parameters of the current wafer; and processing the current wafer for a duration of the target trim time where the temperature of each device die location is adjusted based on the target temperature profile.

* * * * *